United States Patent [19]

Herrandez

[11] Patent Number: 4,599,486

[45] Date of Patent: Jul. 8, 1986

[54] HIGH CAPACITANCE BUS BAR INCLUDING MULTILAYER CERAMIC CAPACITORS

[75] Inventor: Jorge M. Herrandez, Mesa, Ariz.

[73] Assignee: Rogers Corporation, Rogers, Conn.

[21] Appl. No.: 773,431

[22] Filed: Sep. 6, 1985

[51] Int. Cl.$^4$ .............................................. H01B 7/00
[52] U.S. Cl. ................... 174/72 B; 361/306; 361/321
[58] Field of Search .............. 174/72 B; 361/306, 321, 361/328, 329, 330, 407

[56] References Cited

U.S. PATENT DOCUMENTS

| | | | |
|---|---|---|---|
| 4,236,038 | 11/1980 | Taylor | 174/72 B |
| 4,236,046 | 11/1980 | DeVries | 174/72 B |
| 4,266,091 | 5/1981 | Fukuda | 174/72 B |
| 4,399,321 | 8/1983 | Gottlieb | 174/72 B |
| 4,517,406 | 5/1985 | Erdle | 174/72 B |

*Primary Examiner*—Laramie E. Askin
*Attorney, Agent, or Firm*—Fishman & Dionne

[57] ABSTRACT

A miniaturized surface mountable bus bar is presented wherein a sheet of insulating material is laminated between a pair of bus conductors and windows are provided in the laminate structure. A plurality of multilayer ceramic capacitor elements are inserted in the windows and alternate conductive side plates of the capacitors are electrically connected to the two bus conductors. The capacitors are comprised of alternating layers of conductive material and dielectric material having opposed terminating side conductors which are oriented parallel to the sheet of insulating material and the pair of bus conductors after assembly thereof.

7 Claims, 7 Drawing Figures

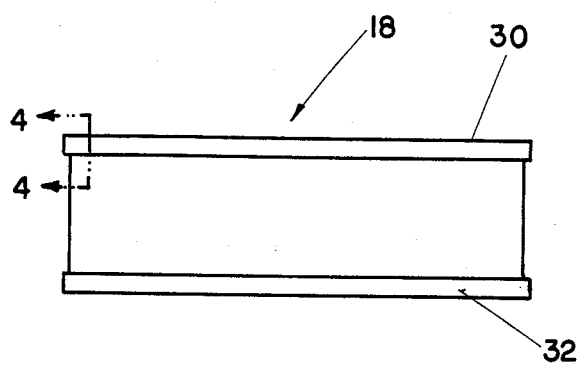
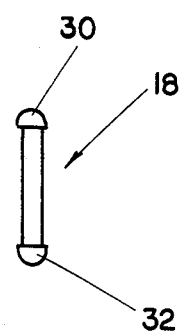
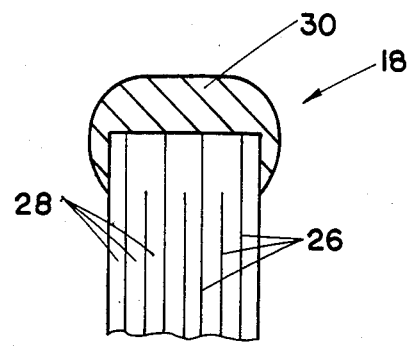

HIGH CAPACITANCE BUS BAR INCLUDING MULTILAYER CERAMIC CAPACITORS

BACKGROUND OF THE INVENTION

This invention relates to surface mountable bus bars and particularly to miniature surface mountable bus bars characterized by a high capacitance. More especially, this invention relates to novel bus bars which incorporate multilayer capacitive elements between pairs of elongated parallel bus conductors.

Conventional bus bars of relatively small or miniature size have been known in the art for a number of years. Such bus bar devices are used for power and/or signal distribution in many systems, such as, for example, computer back panels and integrated circuit systems. Such prior art multilayer bus bars comprise at least two conductive plates (usually in the form of elongated strips or bars of copper) separated by an insulating film. Typically, the separating insulating layer is a plastic dielectric film such as a polyester material. The separater layer and the conductive plates are bonded together by an adhesive. Conventional prior art bus bars of this type have relatively low capacitance which results in the devices being comparatively ineffective in attenuating high frequency noise. This high frequency noise is highly undesirable, especially when the bus bar is used for signal distribution.

One prior art approach to eliminating this noise problem involves connecting capacitors to the bus bar after the completion of the bus bar assembly. While this approach raises the capacitance and minimizes the noise, it results in additional expense and time in manufacturing.

Another type of bus bar structure disclosed in the prior art involves disposing discrete high capacitive elements between a pair of conductors. These bus bars have the desired high capacitance. Examples of such high capacitance bus bars are disclosed in U.S. Pat. Nos. 4,236,038, 4,236,046, 4,266,091 and 4,399,321, all of which are owned by the assignee of the present invention. The high capacitive elements utilized in those inventions are thin layers or chips of dielectric material, usually a ceramic with a high dielectric constant. The opposing surfaces of the chips are typically coated with a thin, integral and continuous film of conductive material and these conductive films are electrically connected to respective opposed surfaces of the bus conductors. U.S. Pat. No. 4,399,321 discloses the use of a multilayer capacitive element.

While well suited for their intended purposes, the high capacitance bus bars described in the foregoing patents are not especially well adapted for use in conjunction with surface mounted circuit components. It is well known that surface mounted circuit components must present a low profile over the surface of the printed circuit or wiring board in order to provide the necessary space savings. The prior art high capacitance bus bars disclosed in the above-mentioned U.S. Patents are all designed for conventional through hole mounting and exhibit a relatively high profile which therefore makes them unsuitable for surface mounted applications.

SUMMARY OF THE INVENTION

The above described and other problems of the prior art are overcome of alleviated by the surface mounted high capacitance bus bar of the present invention. In accordance with the present invention, specially designed multilayer ceramic capacitors are inserted in openings or windows provided in a laminar bus bar structure adapted for surface mounting on a circuit board. An important feature of the present invention is that the multilayer capacitors each include conductive side plates which electrically contact the respective bus conductors. The conductive side plates on the multilayer ceramic capacitor are oriented parallel to the bus conductors and central insulating film which form the laminar bus bar structure. This novel orientation of the specially designed multilayer capacitor chips provides a surface mountable bus bar having a lower overall profile relative to the through hole type bus bars described in the prior art.

The above-discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES:

FIG. 2 is a plan view of a multilayer ceramic capacitor element used in conjunction with the bus bar of FIG. 1;

FIG. 3 is an end view of the capacitor of FIG. 2;

FIG. 4 is a cross-sectional elevation view along the line 4—4 of FIG. 2;

DESCRIPTION OF THE PREFERRED EMBODIMENT

Figure 1:
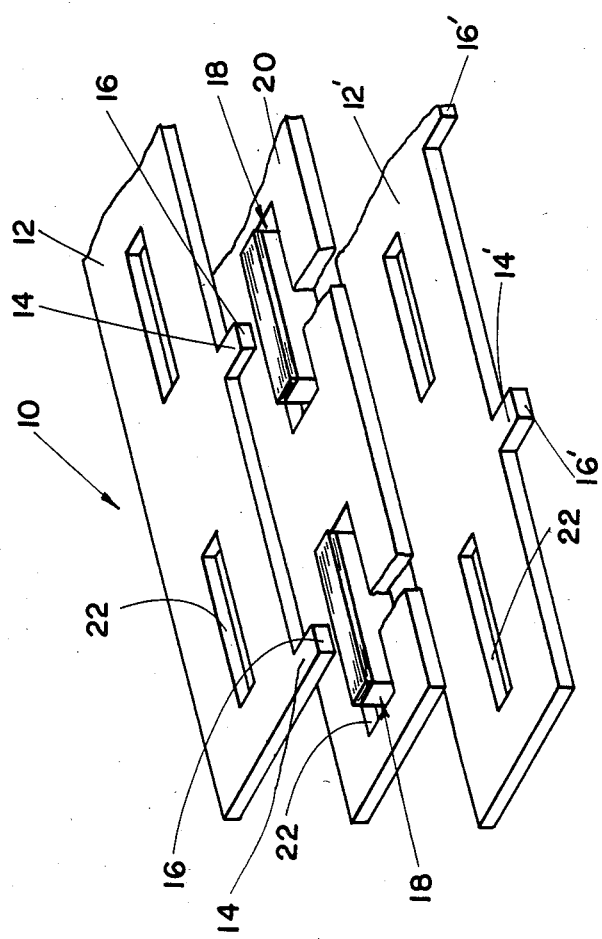
FIG. 1 is an exploded perspective view of a surface mountable bus bar in accordance with the present invention.
Figure 5:
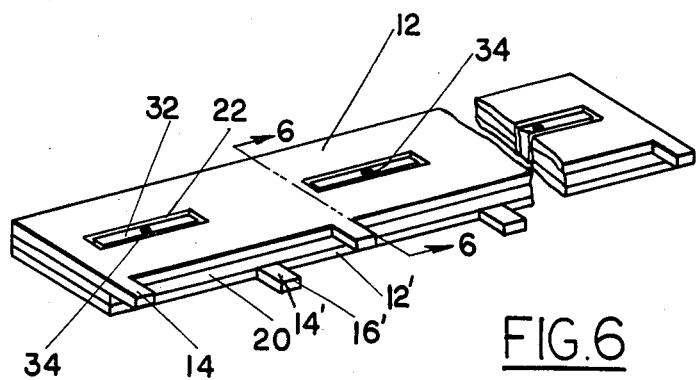
FIG. 5 is a perspective view, partly cut away, of the surface mountable bus bar of FIG. 1 subsequent to assembly.
Figure 6:
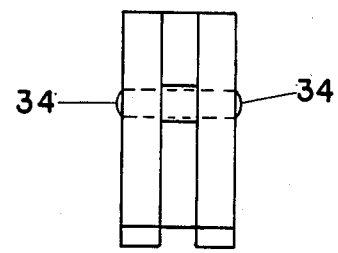
FIG. 6 is a side elevation view along the line 6—6 of FIG. 5.

Referring first to FIG. 1, a portion of a surface mountable miniature bus bar in accordance with the present invention, and prior to assembly and lamination, is shown generally at 10. Bus bar 10 includes a pair of elongated parallel bus conductors 12 and 12' from which project signal or power distribution pins or fingers 14 and 14', respectively. Bus conductors 12 and 12' are comprised of a conductive material (generally copper or copper alloy) and are usually manufactured by a stamping process. Preferably, the bus conductors 12, 12' should be thick or wide enough to permit the base or bottom 16 and 16' of each distribution lead 14, 14' to be self-supportive on the surface of a printed wiring board and to permit a reliable solder joint therebetween. A plurality of multilayer ceramic capacitor elements 18 are included within bus bar 10 between the two bus conductors 12 and 12'. A layer of insulating material 20, which may be comprised of a high temperature plastic material (such as a polyimide or a polyetherimide), is coated with an adhesive on both sides thereof and laminated between the two bus conductors 12 and 12'. This laminate is provided with registered openings 22 through bus conductors 12, 12' and insulating layer 20 which define windows or pockets. Openings 22 are of the same shape and may be of the same size as the multilayer capacitor elements 18. A capacitor element 18 is then positioned within each opening 22 as will be discussed in greater detail hereinafter.

Referring now to FIGS. 2-4, a multilayer chip capacitor element used in conjunction with surface mountable bus bars of the present invention is shown generally at 18. Capacitor element 18 is constructed of a series of conductive layers 26 separated by layers 28 of a material having a high dielectric constant. The dielectric material will, in accordance with the preferred embodiment, be a ceramic such as barium titanate. Each conductive layer 26 has only one of its ends exposed at a side of element 18, with alternate conductive layers 26 having exposed ends at the same side of element 18. The pair of opposed side faces of element 18 to which conductive layers 26 extend are metallized whereby conductive side plates 30 and 32 are defined; the groups of alternating conductive layers 26 being in electrical contact with side plates 30 and 32.

The multilayer capacitor elements 18 may be formed by coating portions of the opposing surfaces of chips or wafers of the ceramic dielectric with a conductive material, such as silver or a conductive adhesive, and then assembling several such layers in a multilayer array. Conductive side plates 30 and 32 may also be comprised of silver or a conductive adhesive. Alternatively, the multilayer capacitor elements 18 may be formed by embedding thin sheets of conductive material in the dielectric material, with alternate sheets of conductive material being connected to side plates 30 and 32 of the same conductive material.

It will be appreciated that the multilayer ceramic capacitor element shown in FIGS. 2-4 has a novel configuration relative to the multilayer capacitor chips generally used in prior art high capacitance miniature bus bars. This difference stems from the conductive layers 26 being exposed at the sides of the element 18 for attachment to conductive side plates 30 and 32 rather than being exposed at the ends of the capacitor element for connection to conductive end plates. For example, in prior art U.S. Pat. No. 4,399,321, the capacitor element disclosed therein utilizes a conventional multilayer capacitor wherein the conductive layers are exposed at the ends thereof and conductive end plates are used which eventually connect to the pair of elongated bus bar conductors. This novel configuration of the multilayer chip capacitor element 18 of FIGS. 2-4 is quite important as it permits a distinctive bus bar construction which leads directly to a low profile surface mountable bus bar. As mentioned, such a low profile bus bar is extremely valuable and necessary in designing surface mountable electronic components.

Turning now to a joint discussion of FIGS. 1-6, as mentioned, the conductive layers 12, 12' and insulating layer 20 are assembled together with the proper fixturing and then hot press laminated to form a permanent laminate structure. Thereafter, windows or slots 22 are formed through the laminate whereupon the multilayer capacitor elements 18 are inserted through the slots. An important feature of the present invention is that the conductive side plates 30 and 32 of multilayer capacitor elements 18 are oriented such that they electrically contact the respective bus conductors 12 and 12'. Stated differently, the conductive side plates 30 and 32 on the capacitor elements 18 are inserted through openings 22 so that they will be parallel to bus conductors 12, 12'. This is in distinct contrast to prior art bus bars such as that disclosed in U.S. Pat. No. 4,399,321 wherein the conductive end plates of those capacitor elements are oriented perpendicular to the bus conductors.

After capacitor elements 18 have been inserted into slots 22, solder paste or a similar electrical adhesive material is applied to both conductive side plates 30 and 32 in the area of window 22. The solder paste is shown generally at 34 in FIGS. 5 and 6. The solder paste is then reflowed to effect a strong mechanical and electrical contact between side conductive plates 32 and 30 and bus bars 12 and 12' respectively. Following such a reflow process, the assembly is cleaned using any appropriate and well known method.

Figure 7:
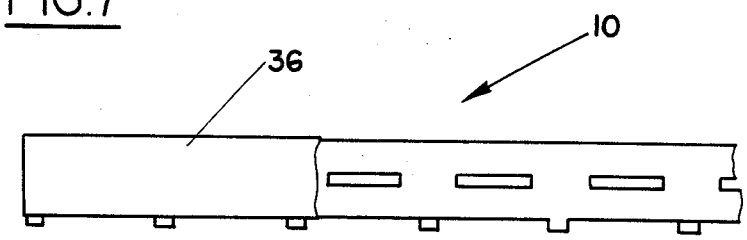
FIG. 7 is a side elevation view of the bus bar of FIG. 1 showing a portion which has been encapsulated.

Preferably, the surface mountable miniature bus bar assembly is then encapsulated or insulated by any suitable method (such as dipping, fluidized bed coating, electrostatic spray, etc.) to provide environmental protection and prevent shorting. Also in a preferred embodiment, leads 14, 14' will not be covered with an encapsulating or insulating layer so as to provide improved soldering to the printed wiring board. An encapsulating or other insulating layer or sheath is shown generally at 36 in FIG. 7.

The surface mountable miniature bus bar of the present invention provides many features and advantages which make it especially suitable for use in conjunction with surface mounted electronic components. An important feature of the present invention is that the multilayer capacitor elements with novel conductive side terminations permit the capacitor elements to be loaded into the bus bar in a parallel orientation with respect to the elongated bus conductors. As a result, the capacitive elements will take up less height in the bus bar and therefore provide an overall low profile thereto. As discussed, a low profile is an extremely necessary feature for surface mountable components. The novel assembly of the bus bar of the present invention also leads to high longitudinal rigidity for accurate positioning on the surface of the printed wiring board.

It will be appreciated that the degree of capacitance in a bus bar constructed in accordance with the present invention will depend upon the number of capacitive elements used in the bus bar as well as the amount of capacitance for each multilayer chip capacitor element used therein.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A surface mountable bus bar assembly comprising: insulating means, said insulating means being comprised of a flat elongated strip of non-conductive material having oppositely disposed first and second faces, said insulating means being provided with at least a first aperture extending therethrough between said faces;

a first bus bar conductor, said first bus bar conductor being bonded to said first face of said insulating means, said first bus bar conductor being provided with at least a first aperture which extends therethrough, said first bus bar aperture being in registration with said first aperture of said insulating means;

a second bus bar conductor, said second bus bar conductor being bonded to said second face of said insulating means, said second bus bar conductor being provided with at least a first aperture which extends therethrough, said second bus bar aperture being in registration with said first aperture of said insulating means;

said first and second bus bar conductors each including leads extending therefrom, said leads being adapted for surface mounting;

at least one multilayer capacitor means, said multilayer capacitor means being comprised of a dielectric material having a high dielectric constant, said capacitor means having a pair of side layers of conductive material on a first pair of oppositely disposed side faces of said capacitor means, said capacitor means being positioned within said registered apertures of said insulating means and said first and second bus bar conductors with said side layers of conductive material being oriented substantially parallel to said insulating means first and second faces and said first and second bus bar conductors;

first means electrically connecting one of the conductive side layers of said capacitor means to said first bus bar conductor; and second means electrically connecting the other of the conductive side layers of said capacitor means to said second bus bar conductor.

2. The bus bar assembly of claim 1 wherein said capacitor means includes spaced conductive layers, said spaced conductive layers being arranged generally transversely with respect to said side layers, the alternate ones of said spaced conductive layers being electrically connected to opposite ones of said side layers.

3. The bus bar assembly of claim 2 wherein said spaced conductive layers are embedded in said dielectric material.

4. The bus bar assembly of claim 1 wherein said first and said second electrical connecting means is solder.

5. The bus bar assembly of claim 1 wherein said first and said second electrical connecting means is conductive adhesive.

6. The bus bar assembly of claim 1 further including: sheath means, said sheath means being non-conductive, said sheath means insulating at least a portion of said first and said second bus bar conductors and said capacitor means.

7. The bus bar assembly of claim 1 wherein said first and second bus bar conductor leads have a thickness which permits self-support for surface mounting.

* * * * *

UNITED STATES PATENT AND TRADEMARK OFFICE
CERTIFICATE OF CORRECTION

PATENT NO. : 4,599,486
DATED : July 8, 1986
INVENTOR(S) : Jorge M. Hernandez

It is certified that error appears in the above-identified patent and that said Letters Patent are hereby corrected as shown below:

On the title page:

Change last name of inventor from "Herrandez" to
--Hernandez--.

Signed and Sealed this

Tenth Day of March, 1987

*Attest:*

DONALD J. QUIGG

*Attesting Officer*

*Commissioner of Patents and Trademarks*